United States Patent
Chen et al.

(10) Patent No.: US 7,662,730 B2
(45) Date of Patent: *Feb. 16, 2010

(54) METHOD FOR FABRICATING ULTRA-HIGH TENSILE-STRESSED FILM AND STRAINED-SILICON TRANSISTORS THEREOF

(75) Inventors: Neng-Kuo Chen, Hsin-Chu (TW); Teng-Chun Tsai, Hsin-Chu (TW); Chien-Chung Huang, Tai-Chung Hsien (TW); Tsai-Fu Chen, Kao-Hsiung Hsien (TW); Wen-Han Hung, Kao-Hsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 323 days.

This patent is subject to a terminal disclaimer.

(21) Appl. No.: 11/164,488

(22) Filed: Nov. 24, 2005

(65) Prior Publication Data

US 2006/0199305 A1 Sep. 7, 2006

Related U.S. Application Data

(60) Provisional application No. 60/593,781, filed on Feb. 13, 2005.

(51) Int. Cl.
*H01L 21/471* (2006.01)

(52) U.S. Cl. .................. 438/791; 438/792; 438/793; 438/794; 257/E21.241; 257/E21.3; 257/E21.302

(58) Field of Classification Search .................. 438/791, 438/792, 793, 794; 257/66, 327, E23.132, 257/E21.241, E21.3, E21.302
See application file for complete search history.

(56) References Cited

U.S. PATENT DOCUMENTS

| 6,277,720 | B1 * | 8/2001 | Doshi et al. .................. 438/586 |
| 6,372,672 | B1 * | 4/2002 | Kim et al. .................... 438/791 |
| 2005/0245012 | A1 * | 11/2005 | Bu et al. ..................... 438/197 |
| 2006/0105106 | A1 * | 5/2006 | Balseanu et al. ......... 427/248.1 |
| 2007/0066022 | A1 * | 3/2007 | Chen et al. .................. 438/287 |

OTHER PUBLICATIONS

Hughey, Massive stress changes in plasma-enhanced chemical vapor deposited silicon nitride films on thermal cycling, Thin Solid Films 460 (2004) 7-16.*
Ven, Advantages of Dual Frequency PECVD for Deposition of ILD and Passivation Films, IEEE, 1990, 194-201.*

* cited by examiner

*Primary Examiner*—Kiesha R Bryant
*Assistant Examiner*—Minchul Yang
(74) *Attorney, Agent, or Firm*—Winston Hsu

(57) ABSTRACT

A method for fabricating an ultra-high tensile-stressed nitride film is disclosed. A PECVD process is first performed to deposit a transitional silicon nitride film over a substrate. The transitional silicon nitride film has a first concentration of hydrogen atoms. The transitional silicon nitride film is subjected to UV curing process for reducing the first concentration of hydrogen atoms to a second concentration of hydrogen atoms.

12 Claims, 15 Drawing Sheets

METHOD FOR FABRICATING ULTRA-HIGH TENSILE-STRESSED FILM AND STRAINED-SILICON TRANSISTORS THEREOF

CROSS REFERENCE TO RELATED APPLICATIONS

This application claims the benefit of U.S. provisional application Ser. No. 60/593,781, filed Feb. 13, 2005.

BACKGROUND OF THE INVENTION

1. Field of the Invention

The present invention relates generally to the fabrication of semiconductor devices, and more particularly, to a method for forming an ultra-high tensile-stressed nitride film and strained-silicon transistor devices thereof.

2. Description of the Prior Art

For decades, chip manufacturers have made metal-oxide-semiconductor (MOS) transistors faster by making them smaller. As the semiconductor processes advance to very deep sub micron era such as 65-nm node or beyond, how to increase the driving current for MOS transistors has become a critical issue.

In order to improve device performance, crystal strain technology has been developed. Crystal strain technology is becoming more and more attractive as a means for getting better performance in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

Generally, strain in silicon can be induced in different ways: through stresses created by films in a form of poly stressor or contact etch stop layer (CESL) and structures that surround the transistor, called process-induced strain, or by employing a strained silicon wafer, where the top layer of silicon has typically been grown on top of a crystalline lattice that is larger than that of silicon. Most leading-edge chip manufacturers employ process-induced stress in some form in production today, typically tensile nitrides to improve NMOS device performance. As known in the art, tensile stress improves electron mobility and compressive stress improves hole mobility.

It is desirable to employ a nitride film having a tensile stress as high as possible in the fabrication of transistor devices. Specifically, according to the roadmap, a nitride CESL film with a tensile stress that is greater than 1.8 Gpa is required in the next-generation 45 nm process. However, so far the nitride film formed by conventional plasma-enhanced chemical vapor deposition (PECVD) methods can only reach a tensile stress of 1.2 GPa at the best.

In light of the above, there is a need in this industry to provide a method of forming nitride films having an ultra-high tensile stress for the next-generation process.

SUMMARY OF THE INVENTION

It is one object of the present invention to provide a method of forming an ultra-high tensile-stressed nitride film for the next-generation process.

It is another object of the present invention to provide a strained-silicon transistor device employing an ultra-high tensile-stressed nitride film as a contact etch stop layer (CESL) or a poly stressor.

According to the claimed invention, a method for fabricating an ultra-high ($\geqq 1.8$ GPa) tensile-stressed nitride film is disclosed. The method includes the steps of:

(1) providing a substrate;

(2) performing a plasma-enhanced chemical vapor deposition (PECVD) process to deposit a transitional silicon nitride film having a first concentration of hydrogen atoms over the substrate; and (3) performing a means for reducing the first concentration of hydrogen atoms of the silicon nitride film to a second concentration of hydrogen atoms.

From one aspect of this invention, a method for fabricating a strained-silicon transistor is provided. The method for fabricating a strained-silicon transistor includes the steps of:

(1) providing a semiconductor substrate;

(2) forming a gate structure on the semiconductor substrate;

(3) forming source/drain regions on the semiconductor substrate adjacent to the gate structure;

(4) performing a plasma-enhanced chemical vapor deposition (PECVD) process to deposit a transitional silicon nitride film having a first concentration of hydrogen atoms over the substrate, wherein the transitional silicon nitride film covers the gate structure and the source/drain regions; and (5) performing a means for reducing the first concentration of hydrogen atoms of the silicon nitride film to a second concentration of hydrogen atoms, thereby transforming the transitional silicon nitride film into the ultra-high tensile-stressed nitride film.

From another aspect of this invention, a metal-oxide-semiconductor (MOS) transistor device is disclosed. The MOS transistor device includes a semiconductor substrate; a gate structure on the semiconductor substrate; source/drain regions on the semiconductor substrate adjacent to the gate structure; an ultra-high tensile-stressed nitride film having a tensile stress being equal to or greater than 1.5 GPa covering the gate structure and the source/drain regions; and an interlayer dielectric (ILD) film over the ultra-high tensile-stressed nitride film.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention is directed to a method of forming an ultra-high ($\geq 1.8$ GPa) tensile-stressed PECVD nitride film and strained-silicon transistor devices employing such high tensile-stressed nitride film.

Figure 1:
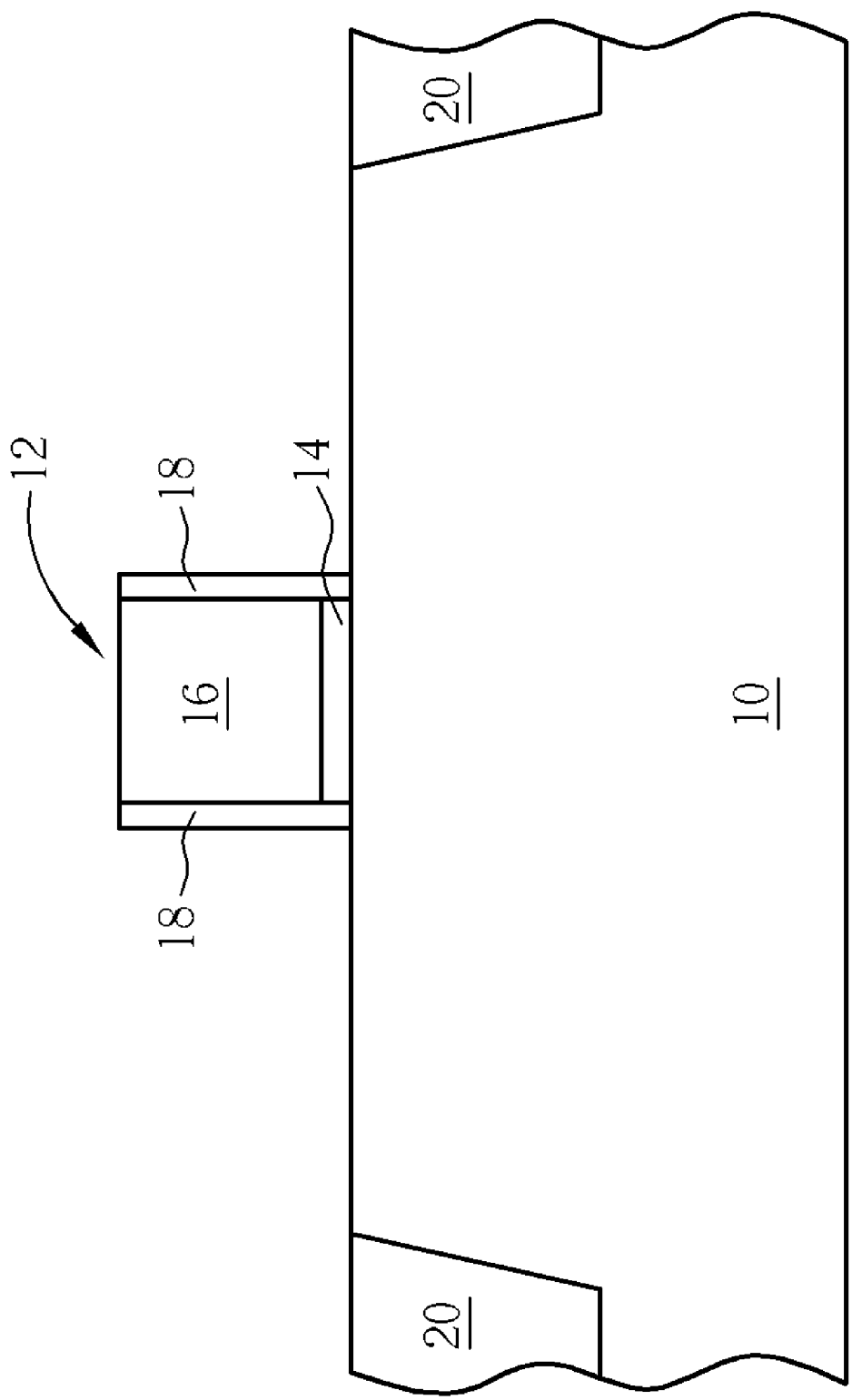
FIGS. 1-8 are schematic, cross-sectional diagrams illustrating a method of fabricating a semiconductor NMOS transistor device in accordance with one preferred embodiment of the present invention.

FIGS. 1-8 are schematic, cross-sectional diagrams showing the steps for fabricating a strained-silicon NMOS transistor according to one preferred embodiment of this invention. As shown in FIG. 1, a semiconductor substrate 10 is provided and a gate structure 12 is formed on the semiconductor substrate 10. Shallow trench isolation (STI) 20 is also provided for isolation purpose. The gate structure 12 comprises a gate oxide layer 14, a gate electrode layer 16 stacked on the gate oxide layer 14, and an offset spacer 18. Preferably, the gate oxide layer 14 is composed of silicon dioxide, and the gate electrode layer 16 is composed of doped polysilicon, but not limited thereto.

The semiconductor substrate 10 may be a silicon substrate, silicon-on-insulator (SOI) substrate or any suitable semiconductor substrate with epitaxial layers. Such epitaxial layers include, but not limited to, silicon epitaxial layer, silicon germanium epitaxial (SiGe) layer or the like.

Figure 2:
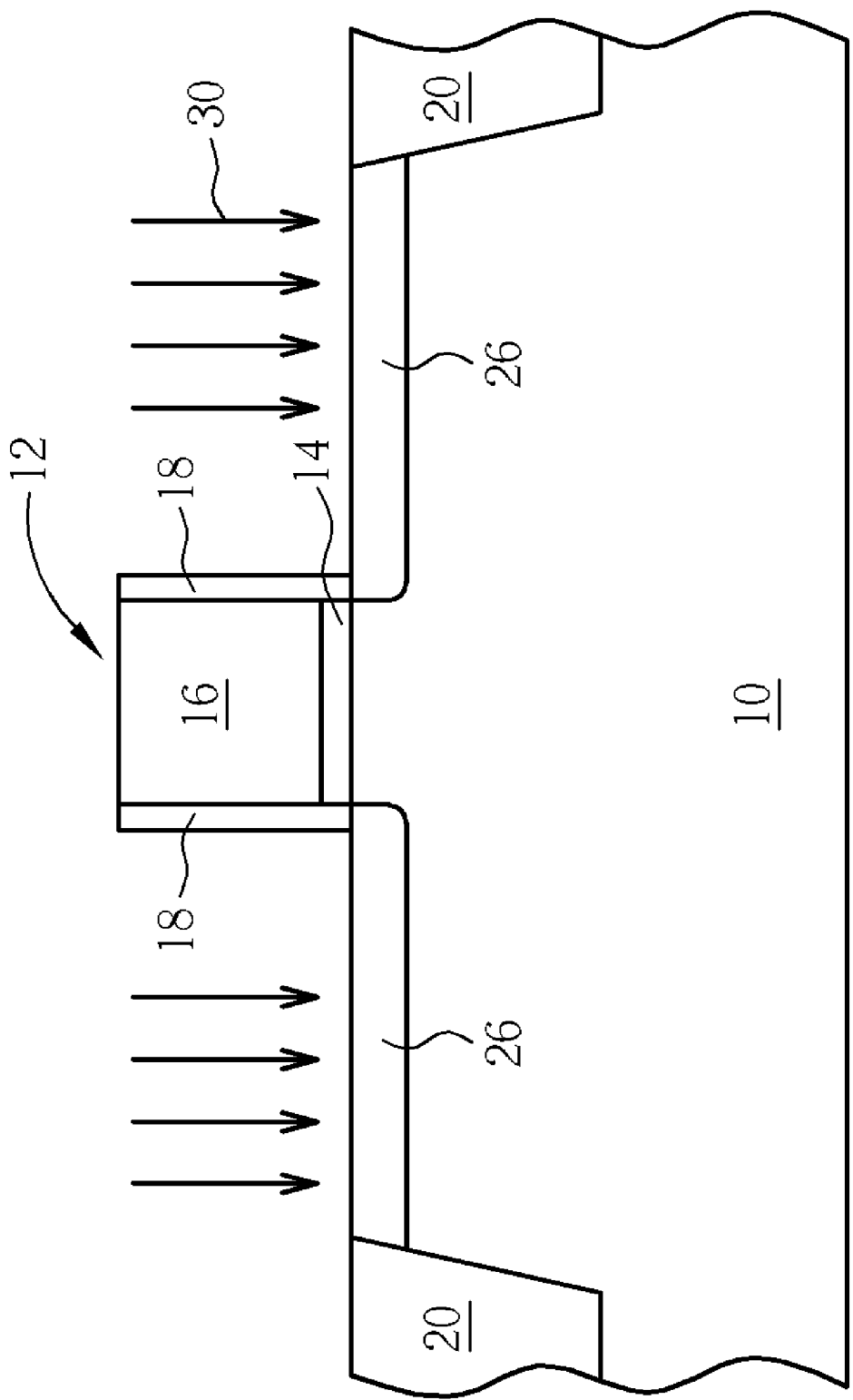

As shown in FIG. 2, an ion implantation process 30 is performed to form a lightly doped source/drain region 26 in the semiconductor substrate 10 adjacent to the offset spacer 18.

Figure 3:
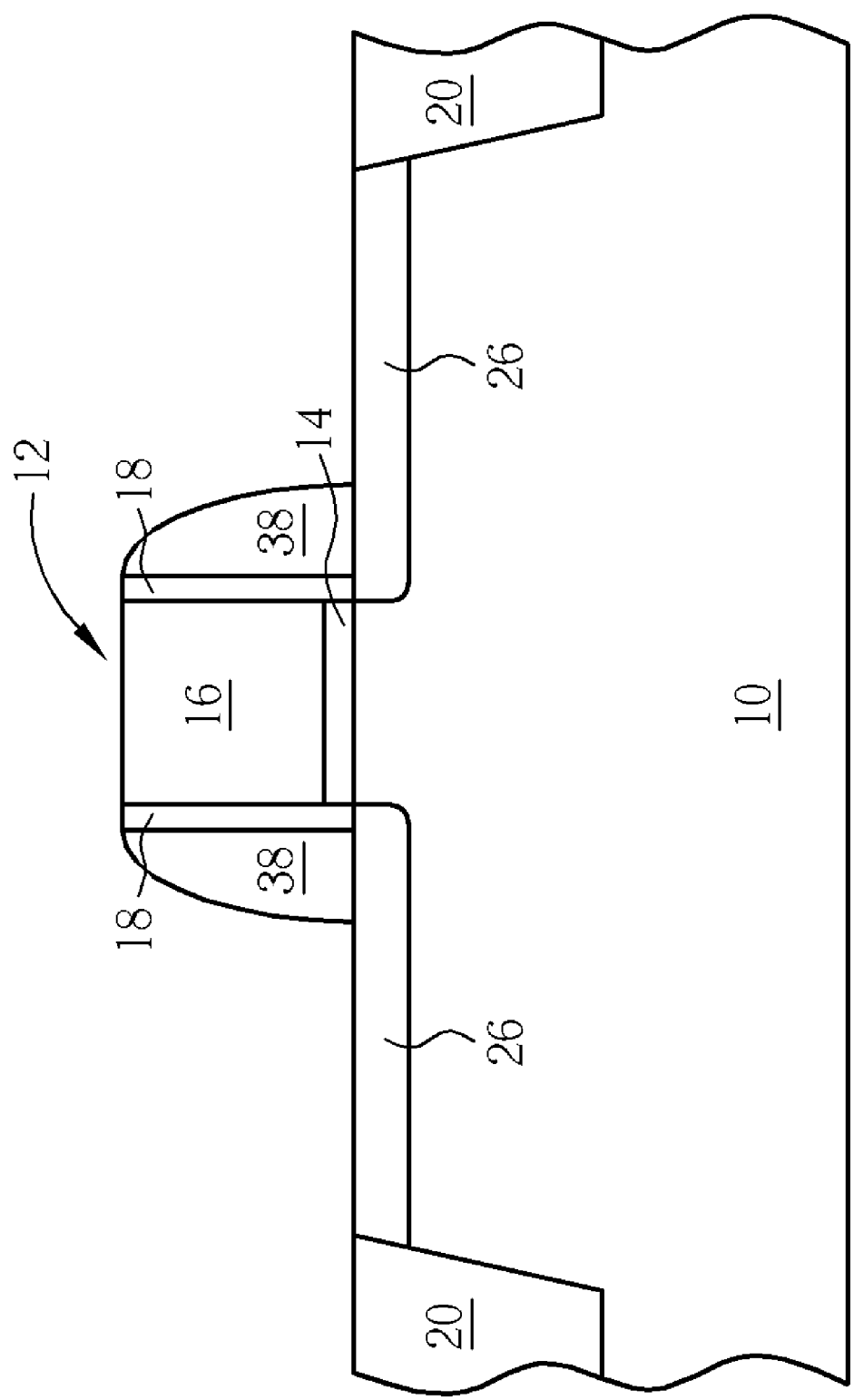

As shown in FIG. 3, silicon nitride spacers 38 are formed on sidewalls of the gate structure 12. The formation of the silicon nitride spacers 38 includes the steps of depositing a silicon nitride film over the semiconductor substrate 10, followed by anisotropically etching back the silicon nitride film.

Figure 4:
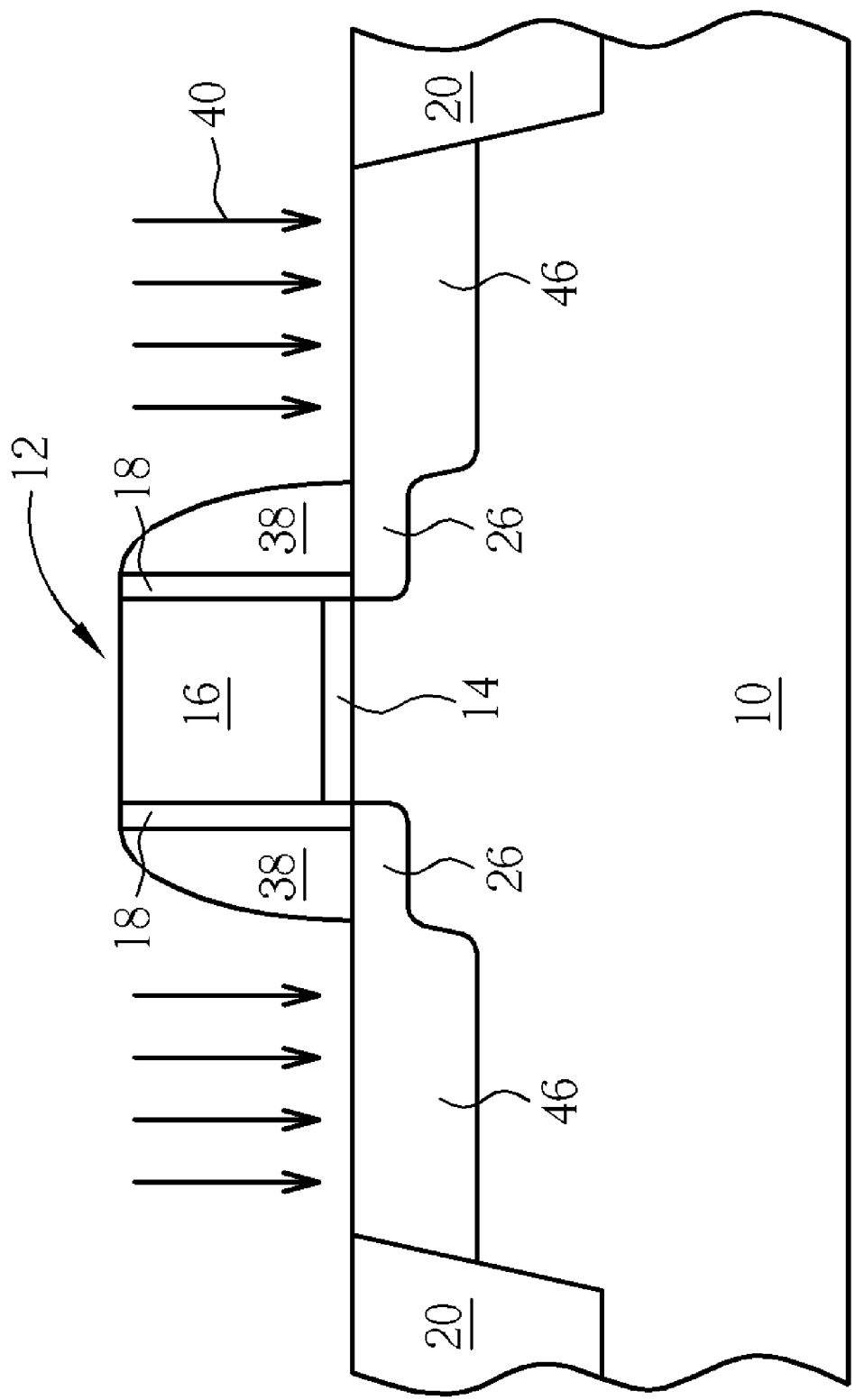

As shown in FIG. 4, an ion implantation process 40 is then carried out to implant dopants species such as arsenic or phosphorus into the semiconductor substrate 10 thereby forming heavily doped source/drain regions 46 adjacent to the spacers 38. A rapid thermal annealing (RTA) process is performed to activate the dopants within the source/drain regions 26 and 46. The RTP process also repairs the damage of the lattice structure of the semiconductor substrate 10 resulting from the ion implantation process.

Figure 5:
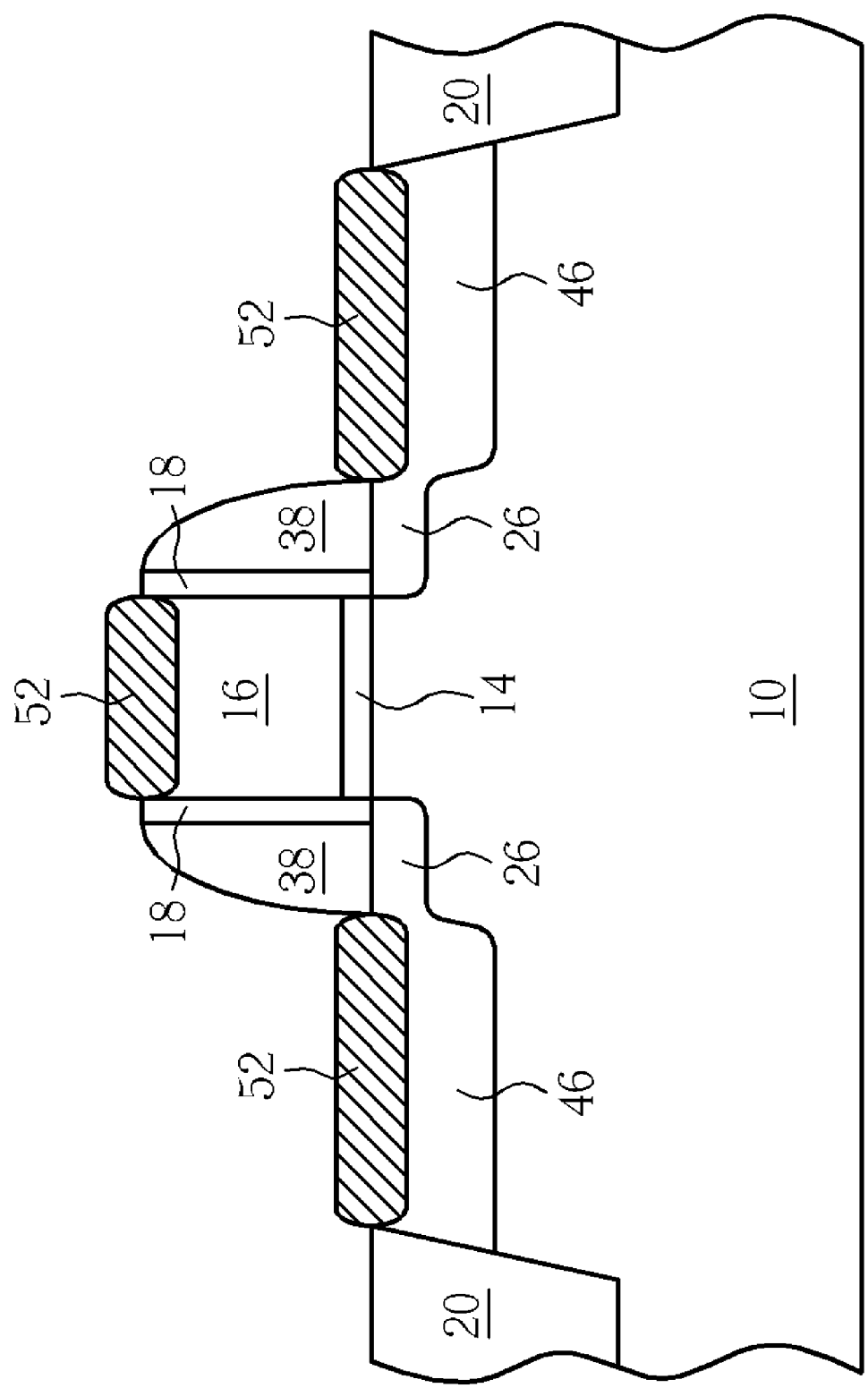

As shown in FIG. 5, a conventional self-aligned silicide or salicide process is carried out to form salicide layers 52 on the source/drain regions 46 and on the gate electrode layer 16. For example, the formation of the salicide layers 52 includes the steps of sputter depositing a metal layer such as cobalt or nickel over the semiconductor substrate 10, reacting the metal with the underlying silicon surfaces, and then removing the unreacted metal layer.

Figure 6:
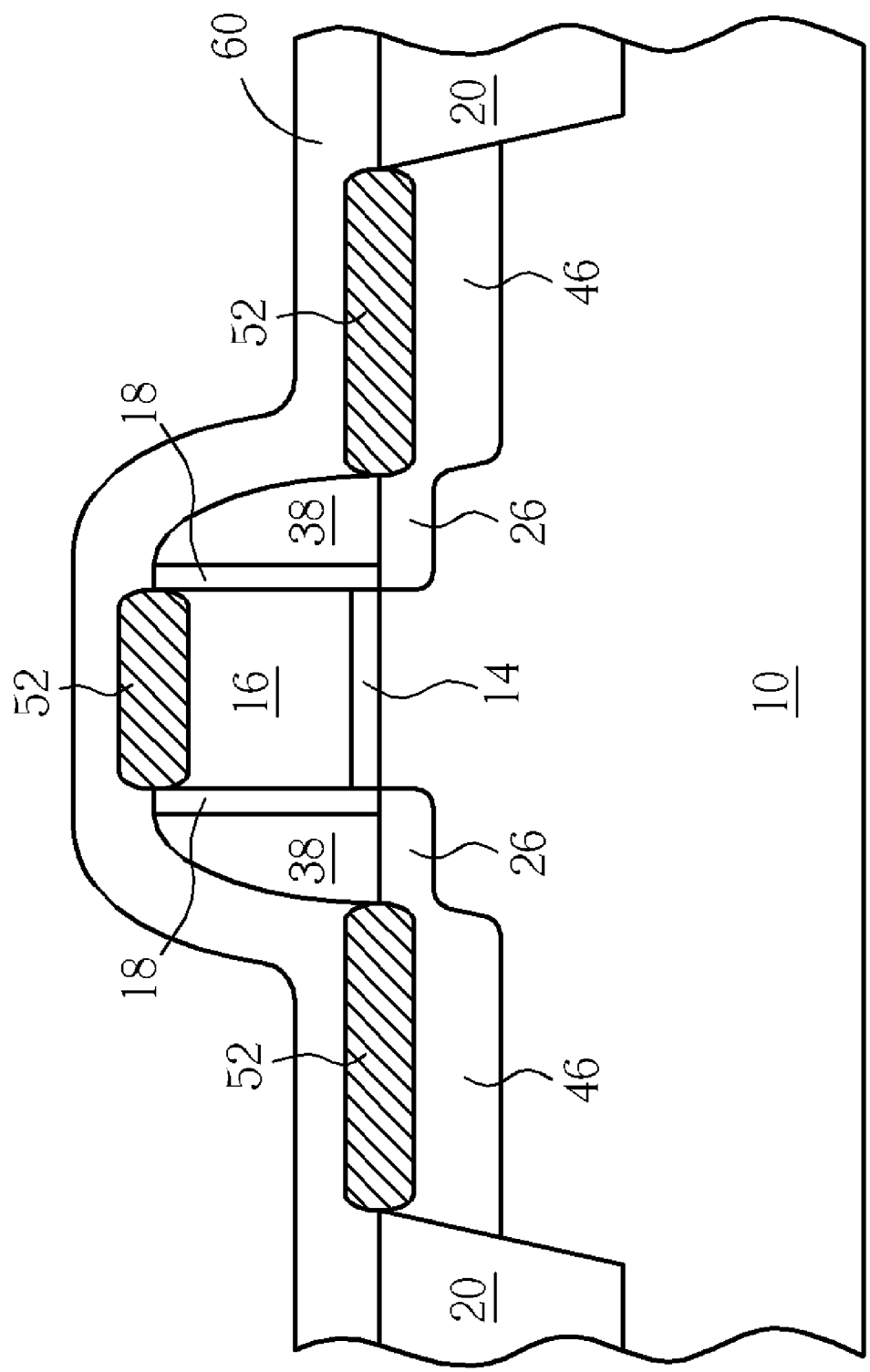

As shown in FIG. 6, a PECVD process is carried out to deposit a tensile-stressed nitride film 60 having a thickness of about 500-1000 angstroms over the semiconductor substrate 10. According to the preferred embodiment, the tensile-stressed nitride film 60 is deposited by utilizing silane ($SiH_4$) and ammonia ($NH_3$) as main reaction gases. Preferably, the aforesaid PECVD is carried out at a low-frequency RF power ranging between 50 Watts and 2700 Watts, a high-frequency RF power ranging between 100 Watts and 200 Watts, preferably less than 150 Watts, and a silane/ammonia ratio (flowrate ratio) ranging between 2 and 20.

According to the preferred embodiment, the tensile-stressed nitride film 60 has a controlled Si—H/N—H ratio ranging between 0.1 and 10, preferably about 1.0. The concentration of Si—H bond ranges between $1E22$ atoms/$cm^3$ and $5E23$ atoms/$cm^3$. The concentration of N—H bond ranges between $1E22$ atoms/$cm^3$ and $5E23$ atoms/$cm^3$. The concentration of hydrogen atoms in the tensile-stressed nitride film 60 ranges between $1E22$ atoms/$cm^3$ and $1E24$ atoms/$cm^3$, preferably greater than $3E22$ atoms/$cm^3$. The nitride film 60 has a tensile-stress that is less than 1.8 GPa, for example, 0-1.2 GPa. According to this invention, the concentration of hydrogen atoms in the tensile-stressed nitride film 60 is preferably kept as high as possible within the aforesaid range.

Figure 7:
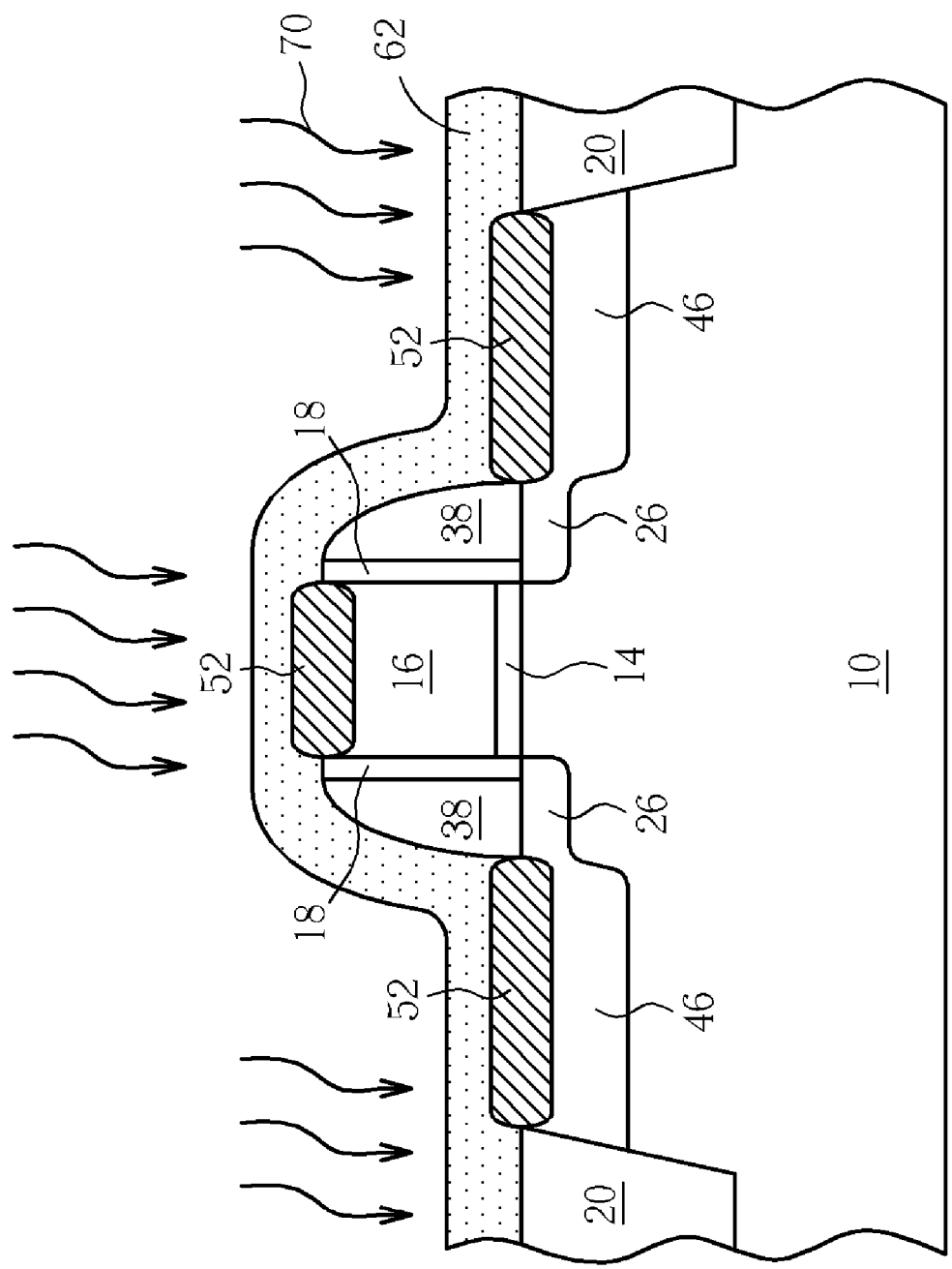

Subsequently, as shown in FIG. 7, a post treatment 70 is performed to cure the nitride film 60. The post treatment 70 is to reduce the concentration of hydrogen atom in the nitride film 60 as much as possible. According to the preferred embodiment, the post treatment 70 is UV curing process executed in vacuum environment, at a temperature of 300-1200° C. for a time period of about 1-30 seconds. In another case, the post treatment 70 may comprise a rapid thermal process (RTP). After the UV curing process, an ultra-high tensile stressed nitride film 62 is produced.

According to the preferred embodiment, the post-treated nitride film 62 has a Si—H/N—H ratio ranging between 0.1 and 10, preferably about 0.3. The concentration of Si—H bond ranges between $1E18$ atoms/$cm^3$ and $5E22$ atoms/$cm^3$. The concentration of N—H bond ranges between $1E18$ atoms/$cm^3$ and $5E22$ atoms/$cm^3$. The concentration of hydrogen atoms in the nitride film 62 ranges between $1E18$ atoms/$cm^3$ and $5E22$ atoms/$cm^3$, preferably less than $1E22$ atoms/$cm^3$, more preferably less than $5E21$ atoms/$cm^3$.

Figure 8:
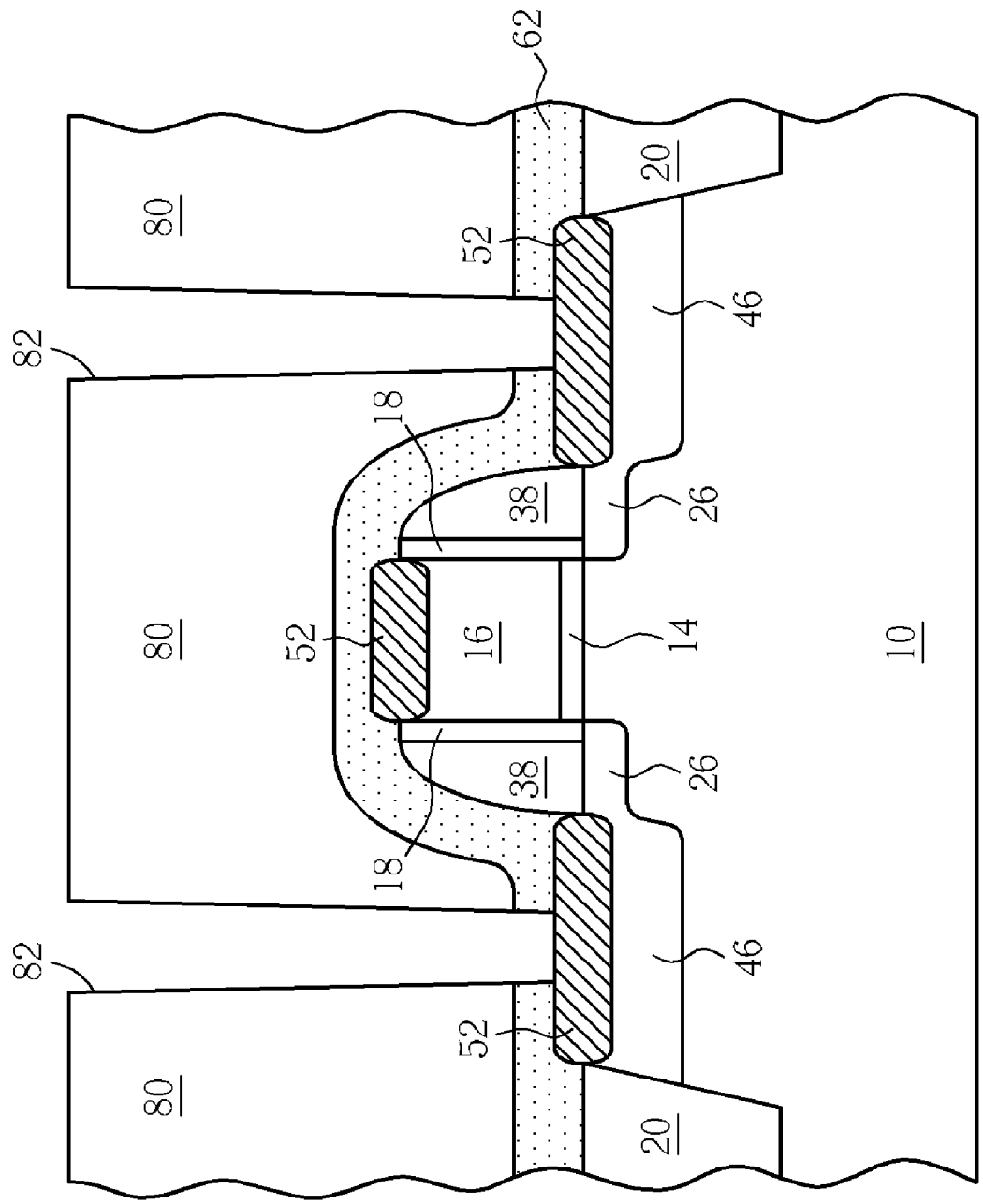

As shown in FIG. 8, an inter-layer dielectric (ILD) film 80 such as silicon oxide is deposited over the post-treated nitride film 62. Conventional lithographic and etching processes are performed to form contact holes 82 in the ILD film 80 and the nitride film 62. The contact holes 82 expose a portion of the underlying salicide layers 52 formed on the source/drain regions 46.

Figure 9:
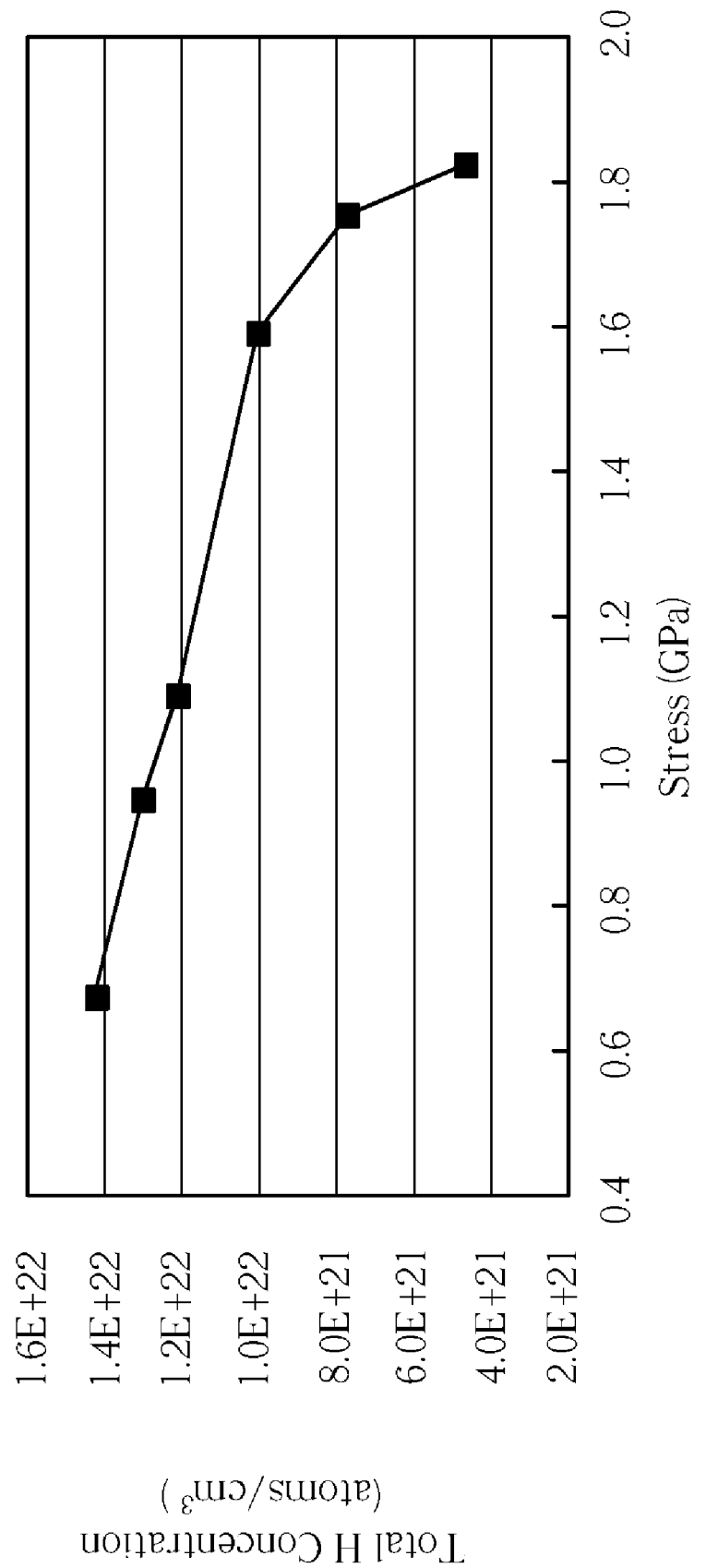
FIG. 9 is a plot showing the relation between the concentration of hydrogen atom in the post-treated nitride film and the stress value in accordance with this invention.
Figure 10:
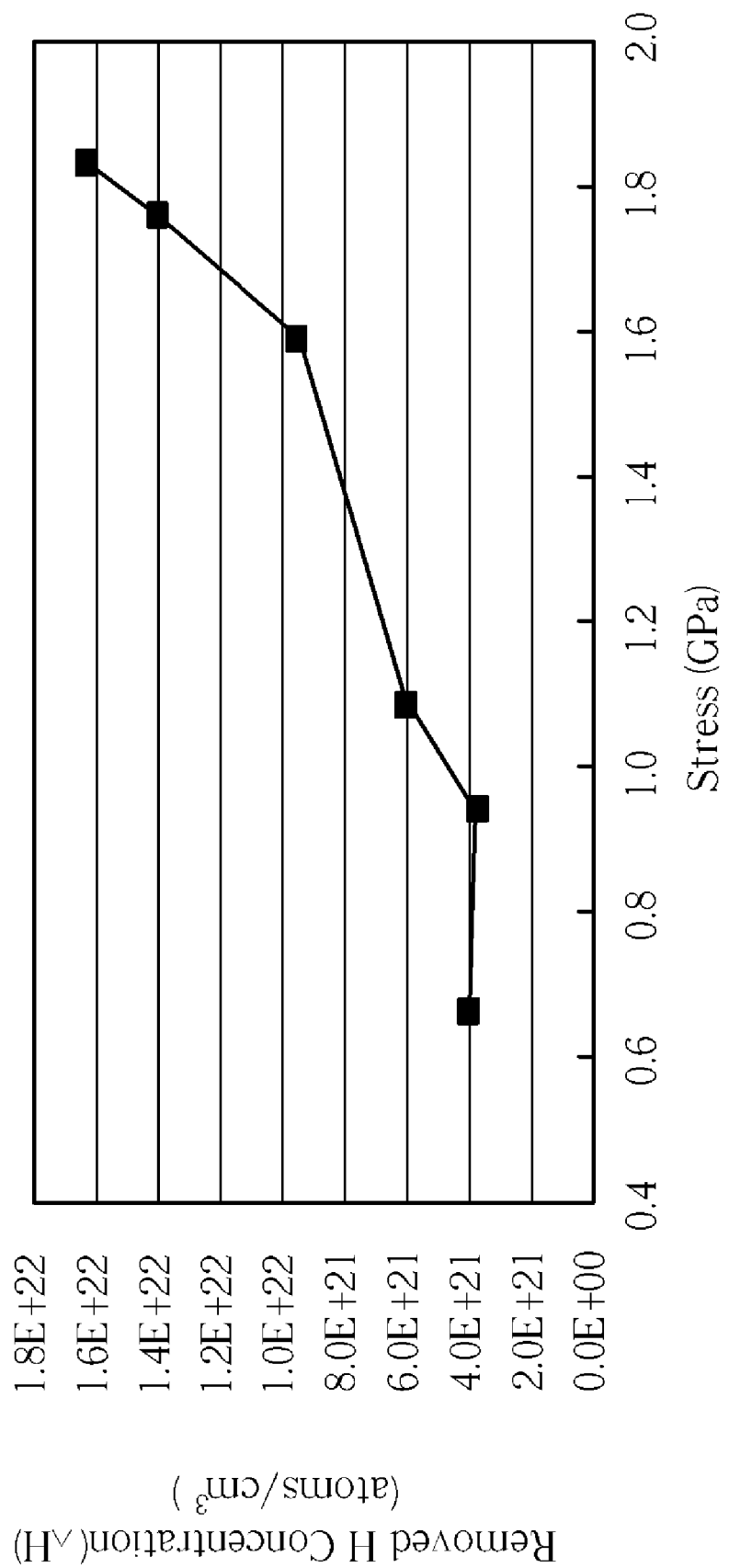
FIG. 10 is a plot showing the relation between ΔH (removed amount of H atoms) and the stress value of the post-treated nitride film.
Figure 11:
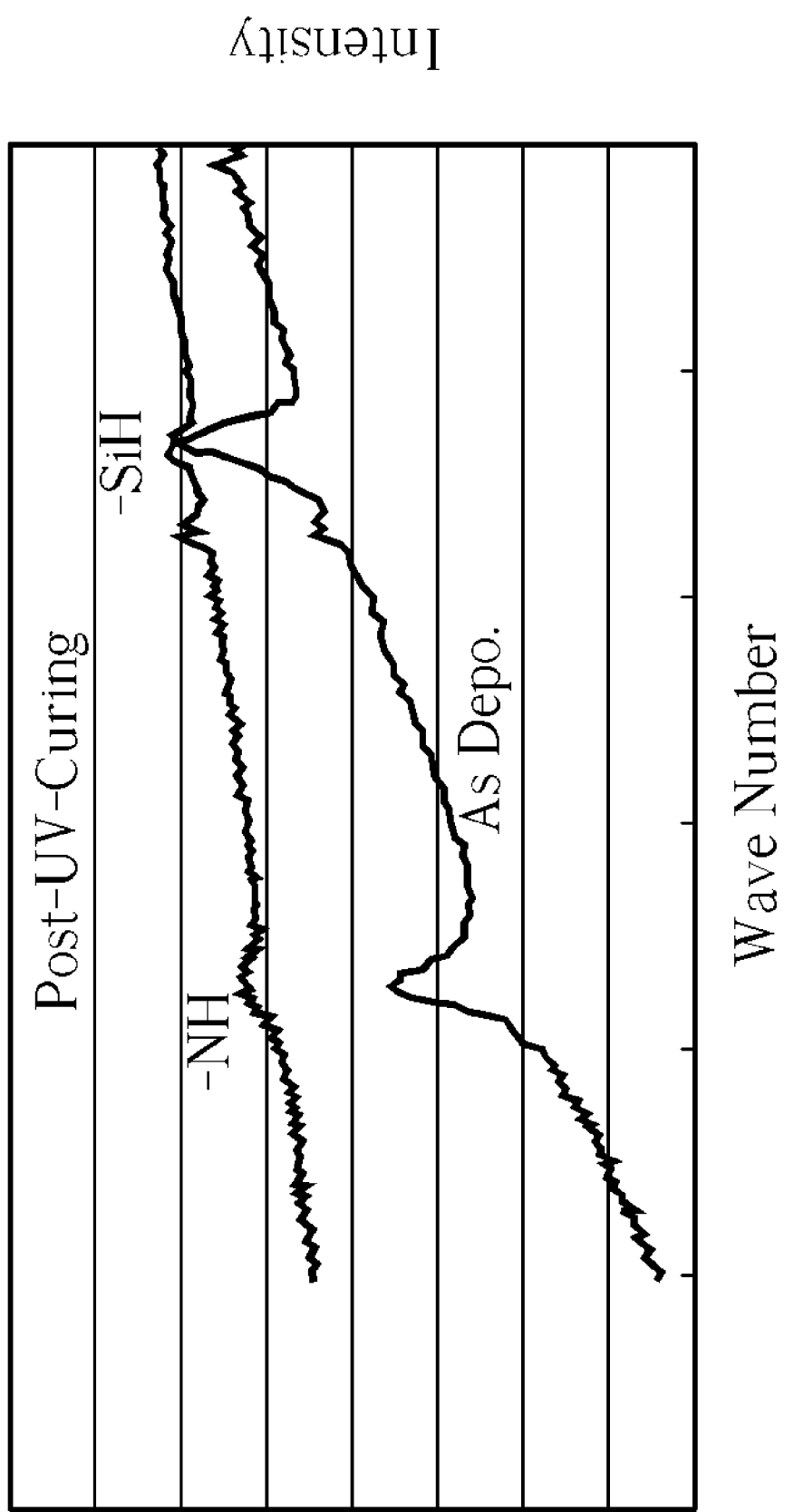
FIG. 11 is a schematic diagram of FTIR comparing the Si—H bond and N—H bond of the PECVD nitride film before UV curing with the Si—H bond and N—H bond of the PECVD nitride film after UV curing.

Please refer briefly to FIGS. 9-11. As shown in FIG. 9, it has been experimentally confirmed that the post-treated nitride film 62 with a final concentration of hydrogen atoms of less than $1E22$ atoms/$cm^3$ has a tensile-stress that is above 1.6 GPa. FIG. 10 is a plot showing the relation between removed amount of H atoms ($\Delta H$) and the stress value of the post-treated nitride film. It has been experimentally confirmed that the more the amount of H atoms is removed the more the stress of the nitride film can be increased. Preferably, in order to get a higher tensile stress, $\Delta H$ is greater than $1E22$ atoms/$cm^3$, more preferably greater than $1.4E22$ atoms/$cm^3$. It is believed that the tensile stress of the post-treated nitride film 62 is increased due to that the significant concentration drop of the hydrogen atoms in the film 62 causes rearrangement of other atoms.

FIG. 11 is a diagram of FTIR showing that both of the concentration of Si—H bond and the concentration of N—H bond of the nitride film decrease after UV curing. The UV curing process is able to increase the stress of the nitride film 60 by breaking Si—H bond and N—H bond of the nitride film and removing released hydrogen atoms.

Figure 12:
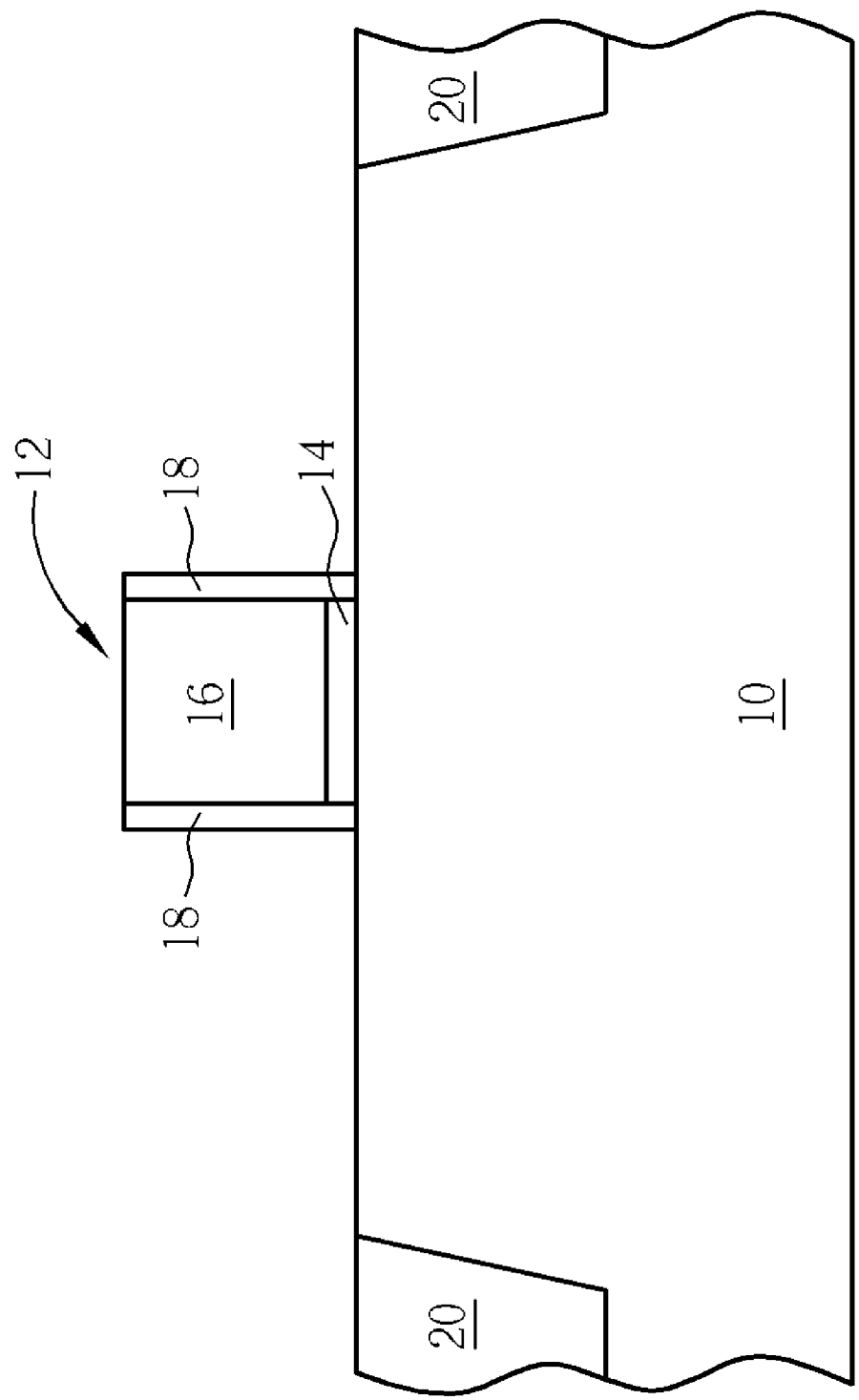
FIGS. 12-15 are schematic, cross-sectional diagrams showing the steps of poly stressor process according to one preferred embodiment of this invention.

As previously mentioned, the ultra-high tensile-stressed nitride film may be applied to poly stressor process. FIGS. 12-15 are schematic, cross-sectional diagrams showing the steps of poly stressor process according to one preferred embodiment of this invention, wherein like numeral numbers designate like elements, regions or layers. As shown in FIG. 12, a semiconductor substrate 10 is provided and a gate structure 12 is formed on the semiconductor substrate 10. Shallow trench isolation (STI) 20 is also provided for isolation purpose. Likewise, the gate structure 12 comprises a gate oxide layer 14, a gate electrode layer 16 stacked on the gate oxide layer 14, and sidewall spacer 18. Preferably, the gate oxide layer 14 is composed of silicon dioxide, and the gate electrode layer 16 is composed of doped polysilicon, but not limited thereto.

The semiconductor substrate 10 may be a silicon substrate, silicon-on-insulator (SOI) substrate or any suitable semiconductor substrate with epitaxial layers. Such epitaxial layers include, but not limited to, silicon epitaxial layer, silicon germanium epitaxial (SiGe) layer or the like.

Figure 13:
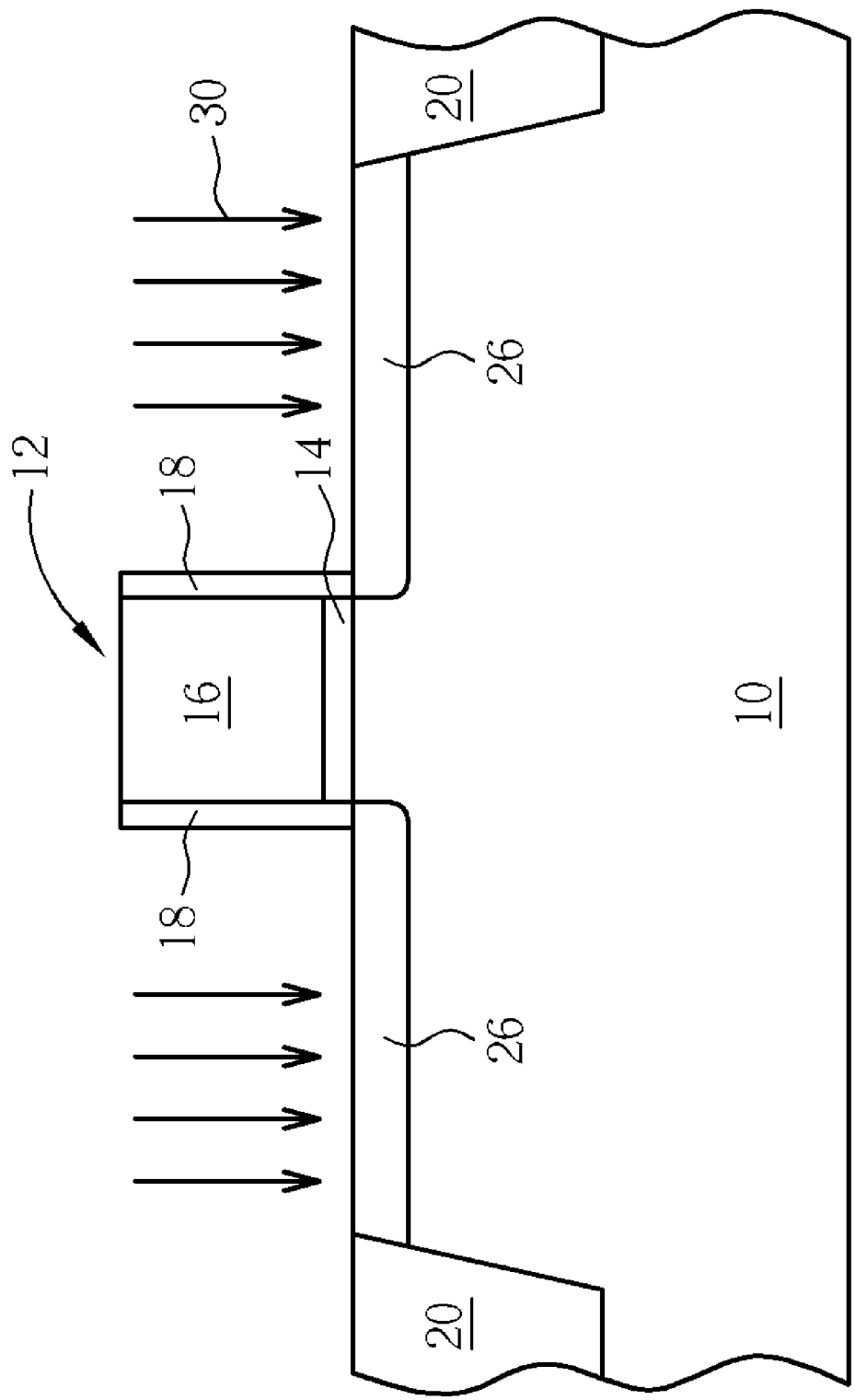

As shown in FIG. 13, an ion implantation process 30 is performed to form a source/drain region 26 in the semiconductor substrate 10 adjacent to the sidewall spacer 18.

Figure 14:
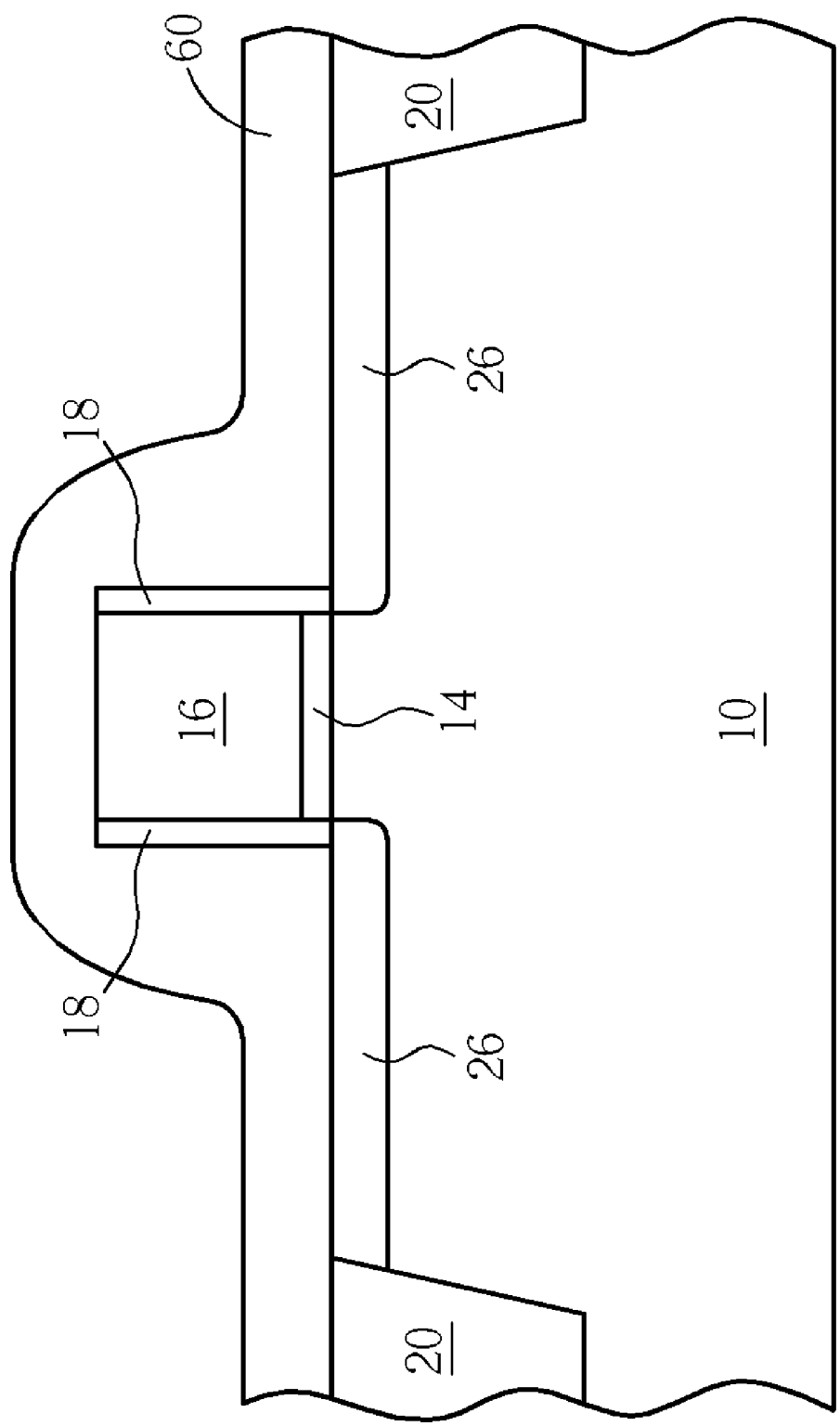

As shown in FIG. 14, a PECVD process is carried out to deposit a tensile-stressed nitride film 60 over the semiconductor substrate 10. The tensile-stressed nitride film 60 covers the gate structure 12 and the source/drain region 26. The tensile-stressed nitride film 60 is deposited by utilizing silane and ammonia as main reaction gases. Preferably, the PECVD is carried out at a low-frequency RF power ranging between 50 Watts and 2700 Watts, a high-frequency RF power ranging between 100 Watts and 200 Watts, preferably less than 150 Watts, and a silane/ammonia ratio (flowrate ratio) ranging between 2 and 20.

According to this invention, the nitride film 60 has a controlled Si—H/N—H ratio ranging between 0.1 and 10, preferably about 1.0. The concentration of Si—H bond ranges between $1E22$ atoms/cm$^3$ and $5E23$ atoms/cm$^3$. The concentration of N—H bond ranges between $1E22$ atoms/cm$^3$ and $5E23$ atoms/cm$^3$. The concentration of hydrogen atoms in the tensile-stressed nitride film 60 ranges between $1E22$ atoms/cm$^3$ and $1E24$ atoms/cm$^3$, preferably greater than $3E22$ atoms/cm$^3$. The nitride film 60 has a tensile-stress that is less than 1.8 GPa, for example, 0-1.2 GPa. According to this invention, the concentration of hydrogen atoms in the tensile-stressed nitride film 60 is preferably kept as high as possible within the aforesaid range.

Figure 15:
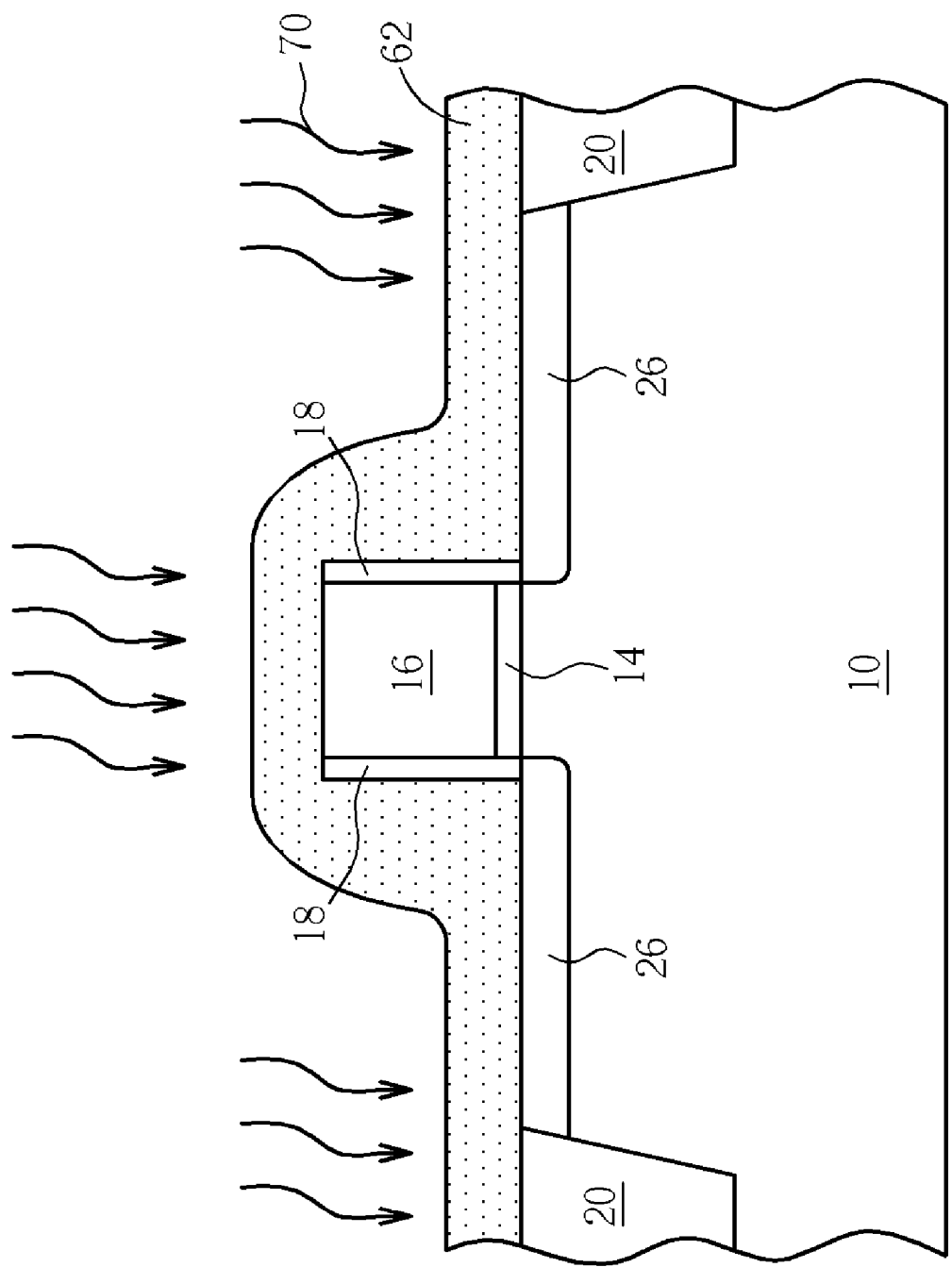

As shown in FIG. 15, a post treatment 70 is performed to cure the nitride film 60. The post treatment 70 is to reduce the concentration of hydrogen atom in the nitride film 60 as much as possible. According to the preferred embodiment, the post treatment 70 is UV curing process. After the UV curing process, an ultra-high tensile stressed nitride stressor film 62 is produced.

According to the preferred embodiment, the post-treated nitride film 62 has a Si—H/N—H ratio ranging between 0.1 and 10, preferably about 0.3. The concentration of Si—H bond ranges between $1E18$ atoms/cm$^3$ and $5E22$ atoms/cm$^3$. The concentration of N—H bond ranges between $1E18$ atoms/cm$^3$ and $5E22$ atoms/cm$^3$. The concentration of hydrogen atoms in the nitride film 62 ranges between $1E18$ atoms/cm$^3$ and $5E22$ atoms/cm$^3$, preferably less than $1E22$ atoms/cm$^3$, more preferably less than $5E21$ atoms/cm$^3$. The nitride stressor film 62, which strains the gate channel, is then removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating an ultra-high tensile-stressed nitride film deposited over a semiconductor substrate, comprising:
   providing a substrate;
   performing a plasma-enhanced chemical vapor deposition (PECVD) process to deposit a transitional silicon nitride film over the substrate, the transitional silicon nitride film having a first concentration of hydrogen atoms ranging between $1E22$ atoms/cm$^3$ and $1E24$ atoms/cm$^3$, and a Si—H/N—H ratio of 1.0; and
   after depositing the transitional silicon nitride film, performing a post-treatment to reduce the first concentration of hydrogen atoms of the transitional silicon nitride film to a second concentration of hydrogen atoms, thereby transforming the transitional silicon nitride film into the ultra-high tensile-stressed nitride film having a tensile stress equal to or greater than 1.5 GPa and having a Si—H/N—H ratio of 0.3, wherein a difference between the first concentration of hydrogen atoms and the second concentration of hydrogen atoms ($\Delta H$) is greater than $1E22$ atoms/cm$^3$.

2. The method according to claim 1 wherein the transitional silicon nitride film is deposited by utilizing silane (SiH$_4$) and ammonia (NH$_3$) as main reaction gases.

3. The method according to claim 1 wherein the PECVD process is carried out at a low-frequency RF power ranging between 50 Watts and 2700 Watts and a high-frequency RF power ranging between 100 Watts and 200 Watts.

4. The method according to claim 3 wherein the high-frequency RF power is less than 150 Watts.

5. The method according to claim 1 wherein the post-treatment includes UV curing process.

6. The method according to claim 1 wherein the second concentration of hydrogen atoms ranges between $1E18$ atoms/cm$^3$ and $5E22$ atoms/cm$^3$.

7. A method for fabricating a strained-silicon transistor, comprising:
   providing a semiconductor substrate;
   forming a gate structure on the semiconductor substrate;
   forming source/drain regions on the semiconductor substrate adjacent to the gate structure;
   performing a plasma-enhanced chemical vapor deposition (PECVD) process to deposit a transitional silicon nitride film having a first concentration of hydrogen atoms ranging between $1E22$ atoms/cm$^3$ and $1E24$ atoms/cm$^3$ over the substrate, and a Si—H/N—H ratio of 1.0, wherein the transitional silicon nitride film covers the gate structure and the source/drain regions; and
   after depositing the transitional silicon nitride film, performing a post-treatment to reduce the first concentration of hydrogen atoms of the transitional silicon nitride film to a second concentration of hydrogen atoms, thereby transforming the transitional silicon nitride film into an ultra-high tensile-stressed nitride film having a tensile stress equal to or greater than 1.5 GPa and a Si—H/N—H ratio of 0.3, wherein a difference between the first concentration of hydrogen atoms and the second concentration of hydrogen atoms ($\Delta H$) is greater than $1E22$ atoms/cm$^3$.

8. The method according to claim 7 wherein the transitional silicon nitride film is deposited by utilizing silane (SiH$_4$) and ammonia (NH$_3$) as main reaction gases.

9. The method according to claim 7 wherein the PECVD process is carried out at a low-frequency RF power ranging between 50 Watts and 2700 Watts and a high-frequency RF power ranging between 100 Watts and 200 Watts.

10. The method according to claim 9 wherein the high-frequency RF power is less than 150 Watts.

11. The method according to claim 7 wherein the post-treatment includes UV curing process.

12. The method according to claim 7 wherein the second concentration of hydrogen atoms ranges between $1E18$ atoms/cm$^3$ and $5E22$ atoms/cm$^3$.

* * * * *